United States Patent
Miura et al.

(10) Patent No.: US 8,035,158 B2
(45) Date of Patent: Oct. 11, 2011

(54) SEMICONDUCTOR DEVICE

(75) Inventors: Yoshinao Miura, Kanagawa (JP); Hitoshi Ninomiya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 833 days.

(21) Appl. No.: 12/110,966

(22) Filed: Apr. 28, 2008

(65) Prior Publication Data
US 2008/0298291 A1 Dec. 4, 2008

Related U.S. Application Data

(63) Continuation of application No. 11/515,899, filed on Sep. 6, 2006, now abandoned.

(30) Foreign Application Priority Data

Sep. 7, 2005 (JP) ................................. 2005-258747
Apr. 27, 2006 (JP) ................................. 2006-122976

(51) Int. Cl.
*H01L 29/66* (2006.01)
(52) U.S. Cl. .................................. 257/329; 257/E29.26
(58) Field of Classification Search .................. 257/329, 257/330, 332, 333, E29.257, E29.26
See application file for complete search history.

(56) References Cited

U.S. PATENT DOCUMENTS

| | | | |
|---|---|---|---|
| 6,621,132 B2 | 9/2003 | Onishi et al. | |
| 2004/0065921 A1 | 4/2004 | Iwamoto et al. | |
| 2005/0181577 A1 | 8/2005 | Hshieh | |

FOREIGN PATENT DOCUMENTS

JP 2004-022716 1/2004

*Primary Examiner* — Bradley K Smith
*Assistant Examiner* — Amar Movva
(74) *Attorney, Agent, or Firm* — Young & Thompson

(57) ABSTRACT

Aiming at realizing high breakdown voltage and low ON resistance of a semiconductor device having the super-junction structure, the semiconductor device of the present invention has a semiconductor substrate having an element forming region having a gate electrode formed therein, and a periphery region formed around the element forming region, and having an field oxide film formed therein; and a parallel p-n layer having n-type drift regions and p-type column regions alternately arranged therein, formed along the main surface of the semiconductor substrate, as being distributed over the element forming region and a part of the periphery region, wherein the periphery region has no column region formed beneath the end portion on the element forming region side of the field oxide film and has p-type column regions as at least one column region formed under the field oxide film.

10 Claims, 11 Drawing Sheets

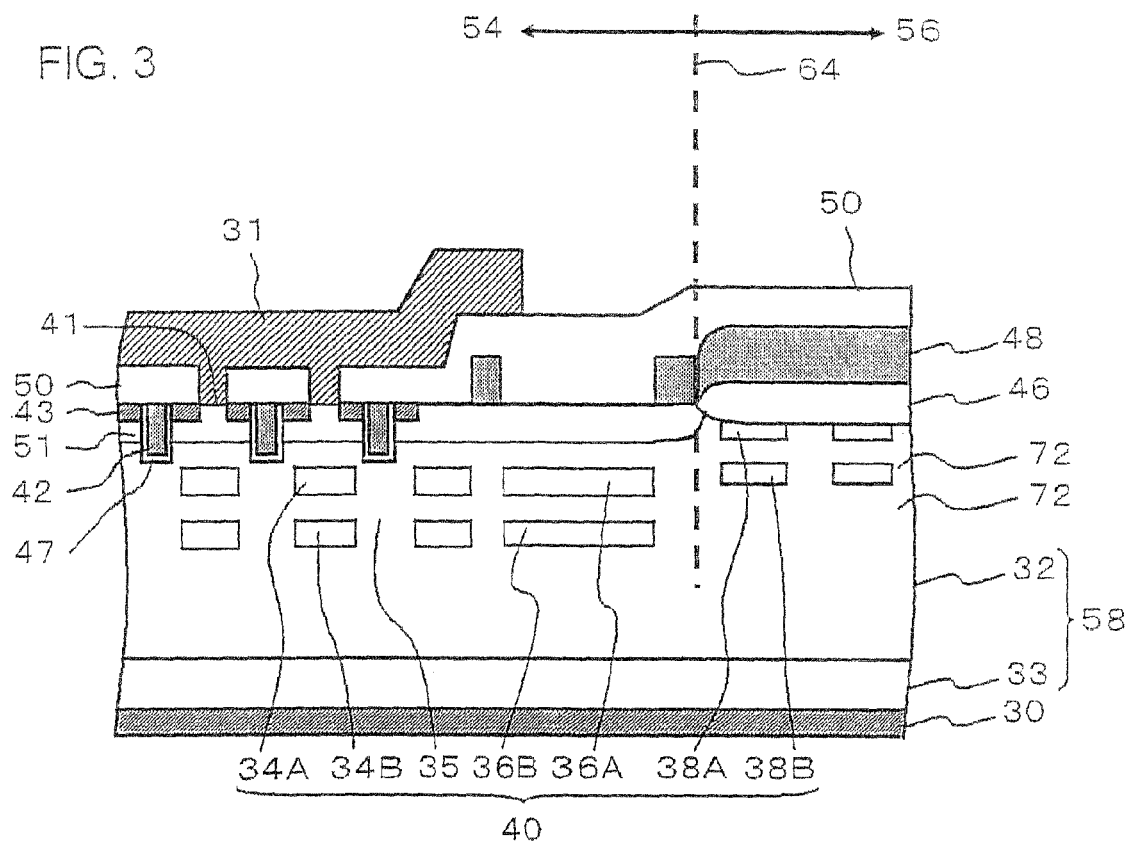

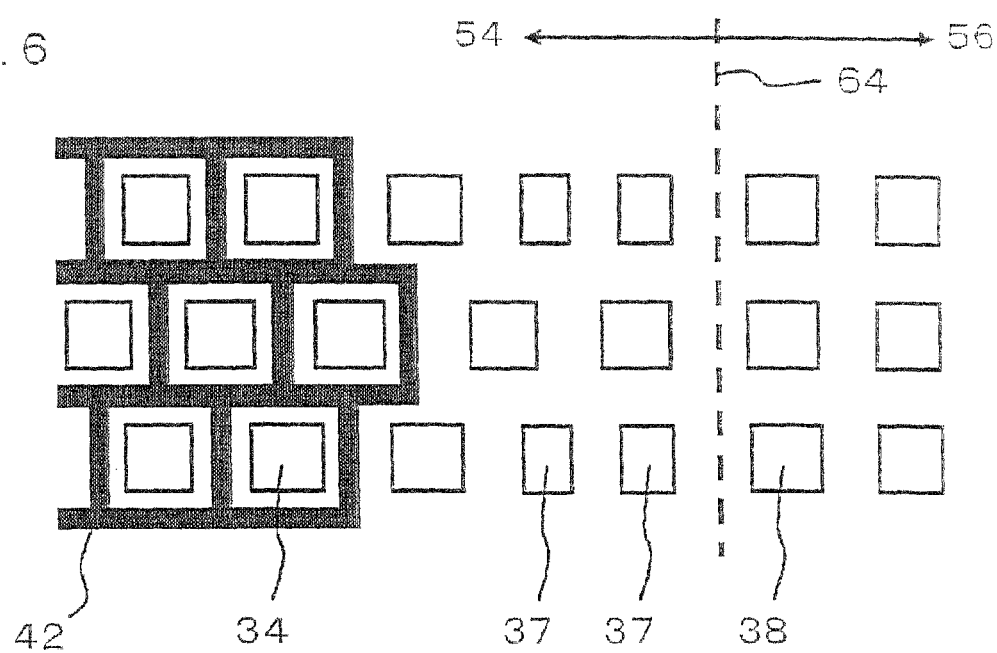

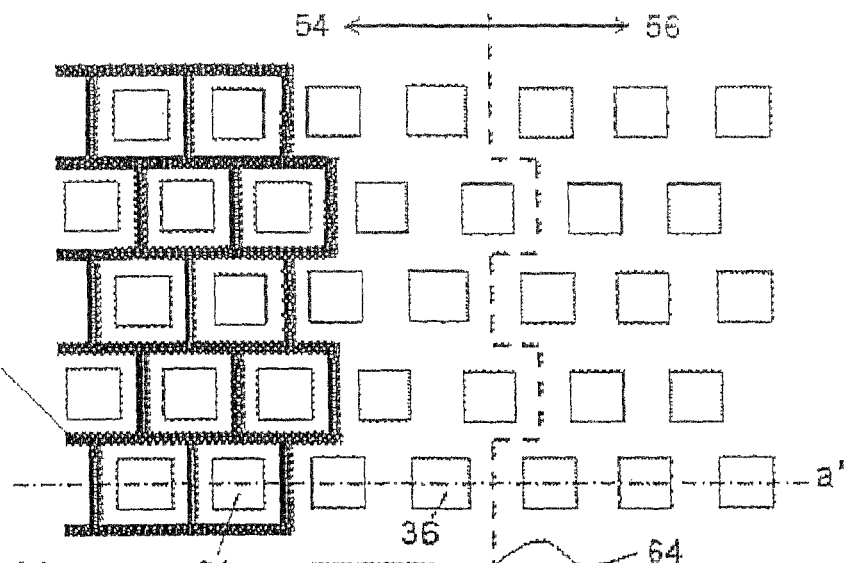
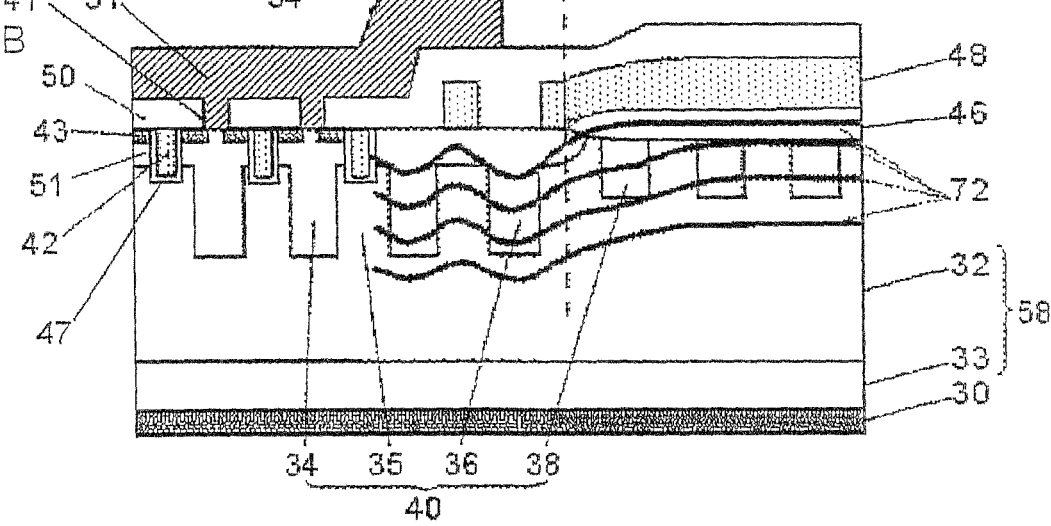

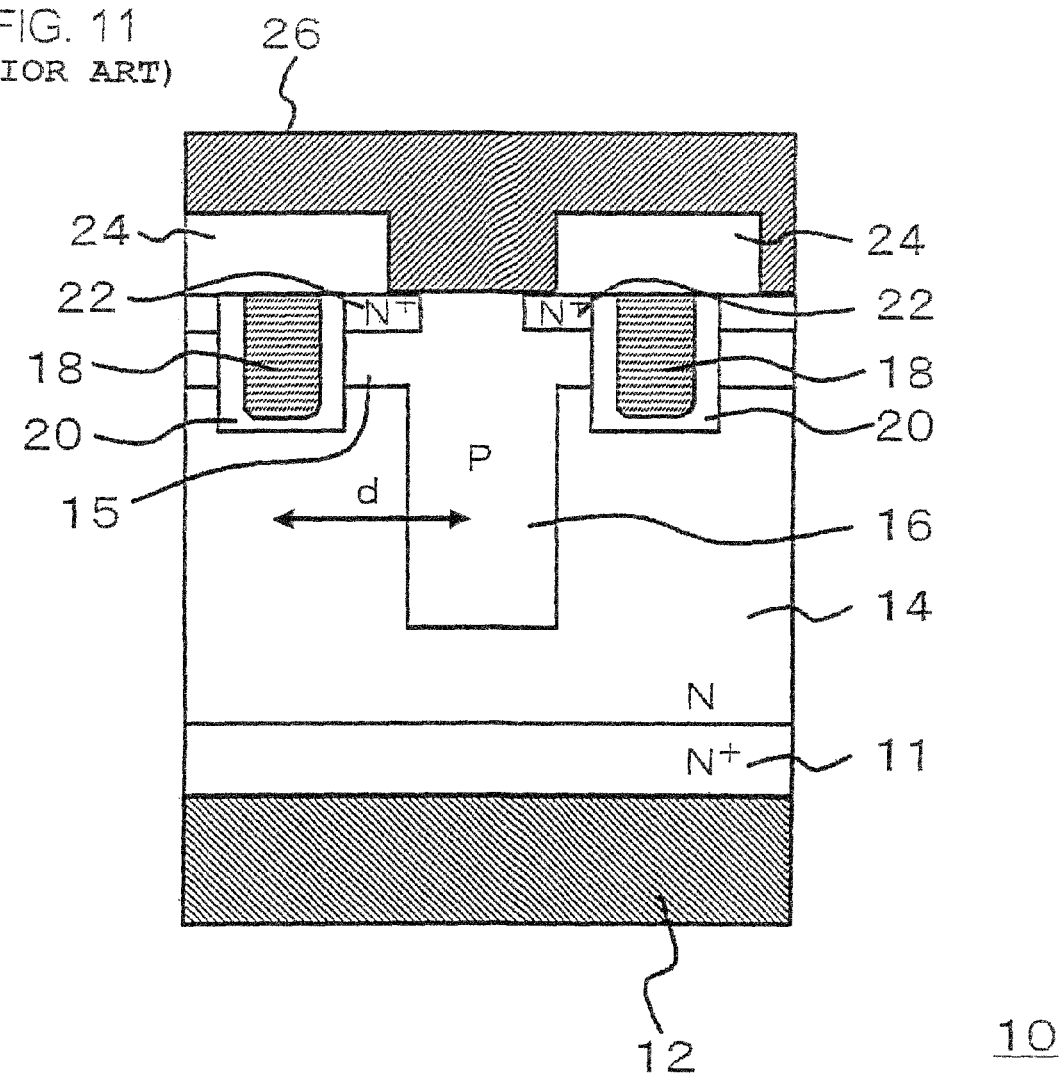

SEMICONDUCTOR DEVICE

This application is based on Japanese patent applications No. 2005-258747 and No. 2006-122976 the contents of which are incorporated hereinto by reference.

DISCLOSURE OF THE INVENTION

1. Field of the Invention

The present invention relates to a semiconductor device, and in particular to a semiconductor device having the super-junction structure.

2. Related Art

Vertical power MOSFET has been proposed as a high-voltage-type MOS field effect transistor (MOSFET). Critical characteristics of this sort of high-voltage MOSFET include ON-resistance and breakdown voltage. The ON-resistance and the breakdown voltage depend on resistivity of an electric field moderating layer, wherein a trade-off relation resides in that lowering in the resistivity by raising the impurity concentration of the electric field moderating layer successfully results in reduction in the ON-resistance, but also in lowering in the breakdown voltage at the same time.

In recent years, the super-junction structure has been proposed based on a technique of lowering the ON-resistance while keeping the breakdown voltage of high-voltage-type MOSFET unchanged.

FIG. 11 shows a configuration of a conventional semiconductor device having this sort of super-junction structure.

A semiconductor device 10 includes a semiconductor substrate 11, an n-type drift region 14 formed on the semiconductor substrate 11 and functions as an electric field moderating layer, an p-type base region 15 formed on the n-type drift region 14, a source region 22 formed in the p-type base region 15, a gate insulating film 20, a gate electrode 18 formed on the gate insulating film 20, an insulating film 24 formed on the gate electrode 18, a source electrode 26 formed on the insulating film 24, as being connected to the source region 22, a p-type column region 16 formed in the n-type drift region 14 between two adjacent portions of the gate electrode 18, and a drain electrode 12 formed on the back surface of the semiconductor substrate 11.

The semiconductor substrate 11, the n-type drift region 14 and the source region 22 herein have a same conductivity type (n-type in this case). The p-type base region 15 and the p-type column region 16 have a conductivity type opposite to that of the n-type drift region 14 (p-type in this case). Dose of impurity is set to an almost same level both for the n-type drift region 14 and the p-type column region 16.

Operations in thus-configured semiconductor device will be explained below. When a reverse bias voltage is applied between the drain and the source under absence of the bias voltage between the gate and the source, depletion layers extend from two p-n junctions between the p-type base region 15 and the n-type drift region 14, and between the p-type column region 16 and the n-type drift region 14, so that current does not flow between the drain and the source, and the device turns into the OFF state. More specifically, the boundary between the p-type column region 16 and the n-type drift region 14 extends in the thickness-wise direction, and each depletion layer extends from the boundary, so that depletion occurred to as wide as distance "d" shown in FIG. 11 results in depletion of the entire portion of the p-type column region 16 and the n-type drift region 14.

Therefore, if the p-type column region 16 and the n-type drift region 14 are specified so as to sufficiently shorten the distance "d", the breakdown voltage of the semiconductor device 10 becomes no more dependent on the impurity concentration of the n-type drift region 14 which functions as the electric field moderating layer. As a consequence, adoption of the super-junction structure described in the above makes it possible to keep the breakdown voltage unchanged, while raising the impurity concentration of the n-type drift region 14 to thereby lower the ON-resistance.

Japanese Laid-Open Patent Publication 2004-22716 discloses a technique of forming the parallel p-n layer not only in the active region which is an element forming region, but also so as to extend to a periphery region around the active region, so as to allow the periphery region to function as a voltage-withstanding structural portion which determines the breakdown voltage of the semiconductor device as a whole, to thereby stabilize the dielectric strength of elements to be formed in the active region.

The semiconductor device having the parallel p-n layer formed therein so as to extend to as far as the periphery region, as shown in Japanese Laid-Open Patent Publication 2004-22716, may successfully be improved in the breakdown voltage, but in view of obtaining a sufficient level of breakdown voltage, it is supposed to be necessary to pay more attention to electric field at the boundary between the element forming region and the periphery region. In particular at the end portion of the element isolation region, special efforts should be made on moderating the electric field and on avoiding discontinuity in the iso-potential surfaces. In this point of view, the configuration in the region corresponded to the boundary region described in the Japanese Laid-Open Patent Publication 2004-22716 is therefore considered as being insufficient, leaving room for improvement.

SUMMARY OF THE INVENTION

The present inventors found out that, when the p-type column regions were formed in the area straight under or generally under the end portion of the field oxide film used as the element isolation region, local points of concentration of the electric field occur on the periphery side of the column regions, and serve as determinant points of the breakdown voltage. This is ascribable to that the distance between the adjacent iso-potential surfaces under application of drain voltage becomes narrower on the field oxide film side, because dielectric constant of the field oxide film (3.9 for $SiO_2$, for example) is smaller than that of Si (approximately 11.9). At around the end portion of the field oxide film, the iso-potential surfaces incline away from a plane parallel to the wafer surface, so that formation of the p-type column regions beneath the end portion of the field oxide film excessively narrows the distance between the iso-potential surfaces due to built-in potential created by the p-n junction at the peripherical side of such column region, and thereby produces the local points of concentration of electric field. The present inventors then found out that the tendency of excessive narrowing of the distance of the iso-potential surfaces on the peripherical side of the column regions can be suppressed, by avoiding formation of the p-type column regions beneath the end portion of the field oxide film, and finally completed the present invention.

According to the present invention, there is provided a semiconductor device having a semiconductor substrate having an element forming region having a gate electrode formed therein, and a periphery region formed around the element forming region, and having an element isolation region formed therein; and a parallel p-n layer having first-conductivity-type drift regions and second-conductivity-type column regions alternately arranged therein, formed along the main surface of the substrate over the element forming region and a part of the periphery region, wherein the periphery region has no column region formed beneath the end portion on the element forming region side of the element isolation region, and has at least one column region formed under the element isolation region.

By avoiding formation of the column regions straight under the end portion of the element isolation region provided in the periphery region as described in the above, the distance of the iso-potential surfaces formed over the parallel p-n region is prevented from being excessively narrowed in the vicinity of the element isolation region provided in the periphery region, and by providing the column regions also under the element isolation region, which means continuous provision of the column regions, the above-described, iso-potential surfaces become continuous also in the element isolation region similarly to as in the element forming region. The iso-potential surfaces now become less likely to cause discontinuity at the end portion of the element isolation region, and thereby concentration of the electric field is suppressed, so that the semiconductor device is realized as having a higher breakdown voltage in a stable manner, and also as having a low ON-resistance. It is therefore made possible to realize high breakdown voltage and low ON-resistance of the semiconductor device having the super-junction structure.

In conclusion, the present invention can realize high breakdown voltage and low ON-resistance of the semiconductor device having the super-junction structure.

BRIEF DESCRIPTION OF THE DRAWINGS

The above and other objects, advantages and features of the present invention will be more apparent from the following description taken in conjunction with the accompanying drawings, in which:

FIG. 3 is a sectional view of a semiconductor device showing another exemplary formation of the p-type column regions in this embodiment;

FIG. 6 is a top view of a semiconductor device showing another exemplary arrangement of the p-type column regions in this embodiment;

FIG. 8A is a top view showing a configuration of the outermost region of a semiconductor device according to a second embodiment, and FIG. 8B is a sectional view taken along line a-a' in FIG. 8A;

FIG. 11 is a drawing showing a conventional semiconductor device having a MOSFET structure.

DETAILED DESCRIPTION OF THE INVENTION

Figure 1A:
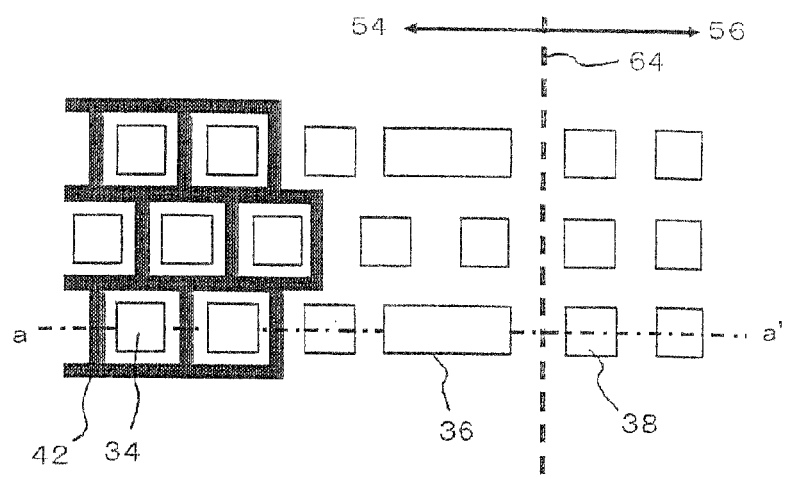
FIG. 1A is a top view showing a configuration of the outermost region of a semiconductor device according to one embodiment.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will describe embodiments of the present invention referring to the attached drawings.

It is to be noted that any common constituents will be given with the same reference numerals, and the explanation will not be repeated. The embodiment below deals with the case where the first conductivity type is n-type, and the second conductivity type is p-type.

Figure 1B:
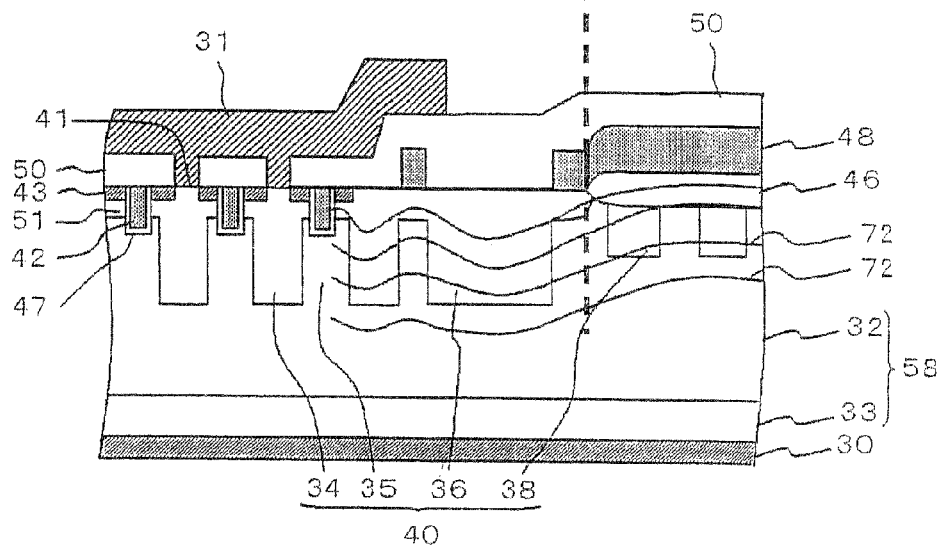
FIG. 1B is a sectional view taken along line a-a' in FIG. 1A.

FIG. 1A is a top view showing a configuration of the outermost region of a semiconductor device according to one embodiment, and FIG. 1B is a sectional view taken along line a-a' in FIG. 1A.

FIG. 1B is a sectional view showing a configuration of the semiconductor device of this embodiment.

The semiconductor device includes a trench-gate-type vertical power MOSFET. The semiconductor device has a semiconductor substrate 58, which is the first-conductivity-type substrate, having an element forming region 54 having a gate electrode formed therein, and a periphery region 56 formed around the element forming region 54 and having a field oxide film 46, which is the element isolation region, formed therein; and a parallel p-n layer 40 having n-type drift regions 35, which are the first-conductivity-type drift regions, and p-type column regions 34, 36, which are the second-conductivity-type column regions, alternately arranged therein, and formed along the main surface of the semiconductor substrate 58, as being distributed from the element forming region 54 to a part of the periphery region 56, wherein the periphery region 56 has no p-type column region formed beneath the end portion 64 on side of the element forming region 54 of the field oxide film 46, and has p-type column regions 38 as at least one column region formed under the field oxide film 46. The parallel p-n layer 40 shown in FIG. 1B includes also the p-type column regions 38. Here, the term "beneath" includes "in direct contact with" and "under".

The semiconductor substrate 58 herein is composed of a high-concentration n-type (n+-type) semiconductor substrate 33, and an epitaxial layer 32 formed by epitaxially growing silicon, while doping therein phosphorus for example, on the surface of the n$^+$-type semiconductor substrate 33. A source electrode 31 and a drain electrode 30 are formed on the main surface and the back surface, respectively, of the semiconductor substrate 58. When the epitaxial layer 32 is considered to be configured by the n-type drift regions 35 as the first-conductivity-type drift regions in the parallel p-n layer 40 and the rest portion as anther first-conductivity-type drift region formed under the parallel p-n layer 40, it may be confirmed that each of the n-type drift regions 35 in the parallel p-n layer 40 is coupled to the another first-conductivity-type drift region.

The parallel p-n layer 40 has, alternately arranged therein, the n-type drift regions 35 and p-type column regions 34, 36, 38 which allow current to flow therethrough in the ON state, and are depleted in the OFF state. The p-type column regions 34, 36, 38 have a columnar form as shown in FIG. 1B, each of which being aligned in the thickness-wise direction of the semiconductor substrate 58, and are two-dimensionally arranged in a plan view as shown in FIG. 1A. That is, the n-type drift regions 35 in the parallel p-n layer 40 are coupled together to be formed a reticular pattern in a plan view (FIG. 1B).

The field oxide film 46 is formed so as to surround the parallel p-n layer 40, a field electrode composed of polysilicon is formed so as to cover the field oxide film 46, and an interlayer insulating film 50 is further formed so as to cover the field electrode 48. It is sufficient for the field electrode 48 to cover at least a part of the field oxide film 46, and the effects of the present invention can be obtained even if it is not electrically connected with the p-type column regions 38 of the parallel p-n layer 40 in the periphery region 56.

That is, the element isolation region may comprises a field oxide film 46, and the end portion on the element forming region 54 side of the element isolation region may coincides with the edge portion on the element forming region 54 side of the field oxide film 46.

On the other hand, the n-type drift region 35 is connected with a gate electrode 42 while placing a gate oxide film 47 in between, where a trench is formed. Source regions 43 are formed around the gate electrode 42 in the surficial portion on the main surface side of the semiconductor substrate 58, and the interlayer insulating film 50 is formed on a part of the surface of the source regions 43. Between every adjacent separated portions of the interlayer insulating film 50, a p-contact 41 allowing the source electrode 31 to contact with each p-type column region 34 is formed. The region including an area having formed therein the p-type column regions 34 connected to the p-type base region 51 having the source region 43 formed therein, to as far as the end portion 64 of the field oxide film 46 is referred to as "element forming region 54", because the area has an element active region which allows current to flow therethrough when applied with voltage through the gate electrode 42.

That is, the element forming region 54 is configured by the p-type base region 51 as a second-conductivity-type base region formed in the semiconductor substrate 58 in an area along the main surface thereof, the source region 43 as a first-conductivity-type source region formed in an area in the p-type base region 51, and the n-type drift regions 35 as a first-conductivity-type drain region formed under the parallel p-n layer 40, so that the element forming region 54 forms a vertical field effect transistor (FET). In this case, a trench may further be formed from the surface of the p-type base region 51 into the n-type drift regions 35 in the parallel p-n layer 40, and the trench may be formed in a reticular pattern in a plan view, so that the gate electrode 42 may be formed in the trench. The gate electrode 42 may also be formed in a reticular pattern in a plan view.

In the ON state of this configuration, a channel is formed in the p-type base region 51 specifically in an area brought into contact with the gate electrode 42, and between the source region 43 and the n-type drift region 35, so that current flows from the source electrode 31 to the drain electrode 30. On the other hand, in the OFF state, the junction portions between the n-type drift region 35 and each of the p-type column regions 34, 36, 38 in the parallel p-n layer 40 are depleted, and the depletion regions expand over the n-type drift region 35 between every adjacent p-type column regions 34, 36, 38.

The OFF state referred to herein means a state having no voltage applied through the gate electrode 42 and consequently having no current flowing through the junction portion, allowing that the voltage applied between the source and the drain is directly applied to the junction portion. The ON state means a state having voltage applied through the gate electrode 42 so as to invert the p-type base region 51 to thereby lower the resistivity, and consequently having voltage between the source and the drain lowered to an extremely low level, to thereby allow current to flow through the junction portion.

The p-type column regions 34, 36 herein are not provided beneath the end portion 64 of the field oxide film 46.

Figure 2A:
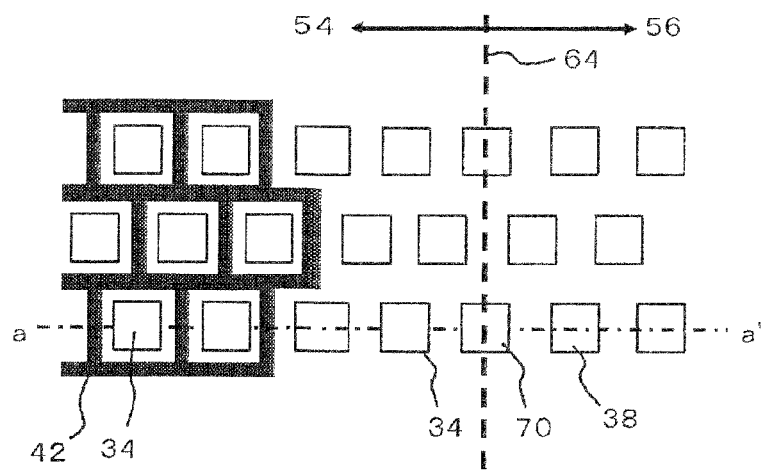
FIG. 2A is a top view showing a configuration of the outermost region of a semiconductor device as a comparative embodiment of this embodiment.
Figure 2B:
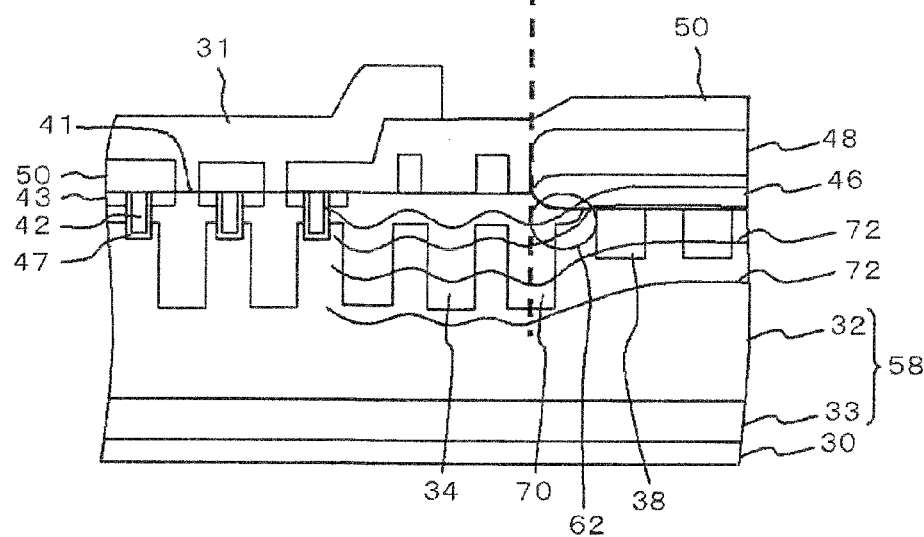
FIG. 2B is a sectional view taken along line a-a' in FIG. 2A.

On the other hand, FIG. 2A is a top view showing a configuration of the outermost region of a semiconductor device as a comparative embodiment of this embodiment, and FIG. 2B is a sectional view taken along line a-a' in FIG. 2A. The semiconductor device shown in FIG. 2A and FIG. 2B differs from this embodiment in that the p-type column regions 70 are provided beneath the end portion 64 of the field oxide film 46. FIG. 1B and FIG. 2B show iso-potential surfaces 72 obtained by simulation. From comparison between FIG. 1B and FIG. 2B, it is found that FIG. 2B shows an electric field concentration point 62 where the distance between the adjacent iso-potential surfaces 72 narrows.

As is clear from the above, by avoiding provision of the column regions beneath the end portion 64 of the field oxide film 46 provided in the periphery region 56, as shown in FIG. 1B, the distance of the adjacent iso-potential surfaces 72 formed over the parallel p-n layer 40 is prevented from being excessively narrowed in the vicinity of the field oxide film 46 provided in the periphery region 56.

Provision of the column regions also under the field oxide film 46 means provision of the column regions as continued from the element forming region 54, so that the iso-potential surfaces 72 become continuous also in the field oxide film 56 in the periphery region 56, similarly to as in the element forming region 54. The iso-potential surfaces 72 therefore become less likely to cause discontinuity at the end portion 64.

The p-type column regions may be buried in the n-type drift region 35, as being surrounded by the n-type region. For example, as shown in FIG. 3, it is allowable to provide p-type column regions 34A, 36A, 38A as being spaced from the p-type base region 51. Further, the p-type base region 51 may be formed in the semiconductor substrate 58 in an area along the main surface thereof, and the p-type base region 51 may be extended from the element forming region 54 to the portion being overlapped with the field oxide film 46, and the p-type base region 51 is allowed not to contact to the column region 36A formed beneath the field oxide film 46. That is, it is still also allowable, as shown in FIG. 3, to provide p-type column regions as being split in the thickness-wise direction of the epitaxial layer 32 which is an n-type region, such as being provided as p-type column regions 34A, 34B, and p-type column regions 36A, 36B, and p-type column regions 38A, 38B. The present inventor have confirmed that provision of the p-type column regions in a way, such as being buried in the n-type drift region 35, and as being spaced from the p-type base region 51, and occasionally also from the main surface of the epitaxial layer 32 (that is, the interface of the epitaxial layer 32 and the field oxide film 46), gave results of simulation analysis of state of electric field, or iso-potential surfaces, similar to those in the case where the p-type column regions and the p-type base region were connected, and occasionally even in the case where the p-type column regions were provided so as to reach the main surface of the epitaxial layer 32. It has been also confirmed that formation of the p-type column regions, composed of a plurality of regions provided as being spaced from each other in the thickness-wise direction of the epitaxial layer, gave results of simulation analysis of the iso-potential surfaces similar to those in the case where each of the p-type column regions was formed by a single region which was continuous in the thickness-wise direction of the epitaxial layer.

Figure 4:
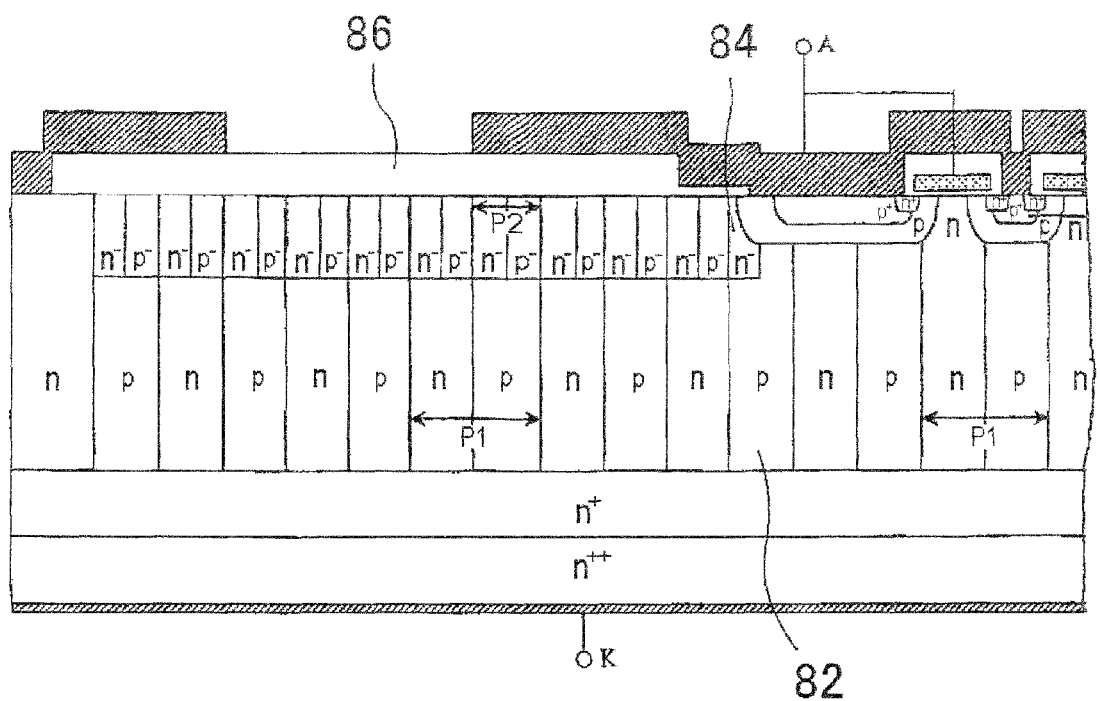
FIG. 4 is a sectional view showing an exemplary semiconductor device shown in the prior art.

Japanese Laid-Open Patent Publication 2004-22716 discloses an embodiment as shown in FIG. 4, wherein an n-type drift region 84 is formed beneath the end portion of the active portion (corresponded to the present element forming region) of the field insulating film 86, and this seems to be configured similarly to this embodiment at first view, whereas a p-type partition region 82 under the end portion of the configuration shown in FIG. 4 is equivalent to the p-type column regions formed in the epitaxial layer 32 as being spaced from the p-type base region 51 of the embodiment shown in FIG. 3. On the other hand, because interposition of the n-type region between the p-type column regions and the p-type base region resulted in the state of electric field similar to that in the case having the p-type column regions and the p-type base region connected with each other as described in the above, it is considered that the state shown in FIG. 4 shows a state of electric field similar to that achieved in the semiconductor device shown in FIG. 2.

As a consequence, by avoiding provision of the column regions beneath the end portion of the field oxide film 46 provided in the periphery region 56 as described in the above, concentration of electric field can be suppressed anywhere in the parallel p-n layer 40, so that the semiconductor device is realized as having a higher breakdown voltage in a stable manner, and also as having a low ON-resistance. It is therefore made possible to realize high breakdown voltage and low ON-resistance of the semiconductor device having the super-junction structure.

Figure 5A:
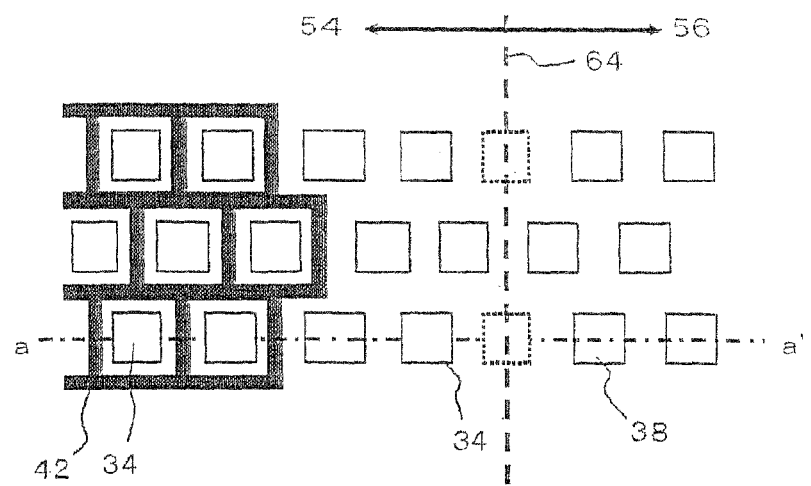
FIG. 5A is a top view showing a configuration of the outermost region of a semiconductor device as a comparative embodiment of this embodiment.
Figure 5B:
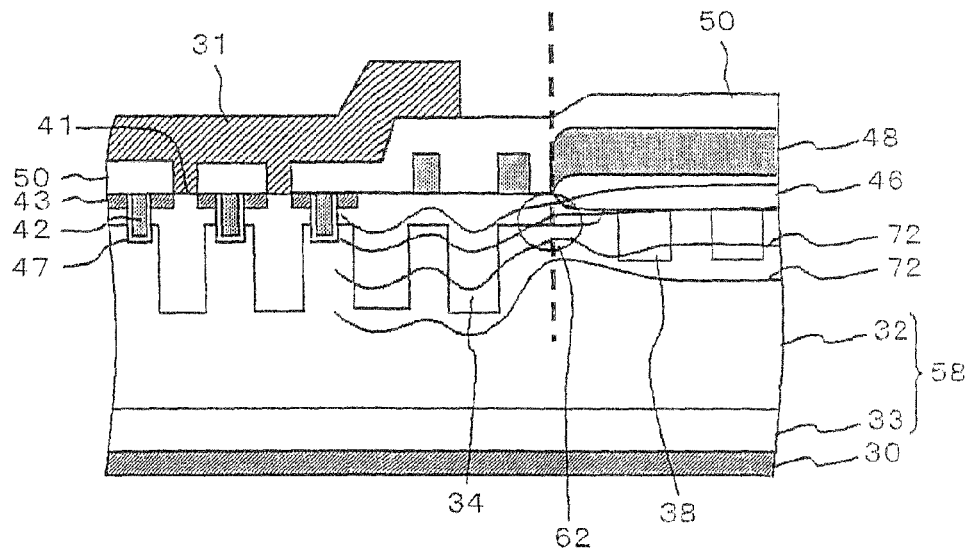
FIG. 5B is a sectional view taken along line a-a' in FIG. 5A.

FIG. 5A is a top view showing a configuration of the outermost region of a semiconductor device as a comparative embodiment of this embodiment, and FIG. 5B is a sectional view taken along line a-a' in FIG. 5A. The semiconductor shown in FIG. 5A and FIG. SB has no p-type column regions corresponding to the p-type column region 70 as shown in the semiconductor device of FIG. 2A and FIG. 2B which is formed beneath the end portion 64 of the field oxide film 46, and has the distance between two p-type column regions 34, 38, disposed while placing the end portion 64 of the field oxide film 46 in between, larger than in this embodiment. Also FIG. 5B shows the iso-potential surfaces 72 obtained by the simulation, similarly to as described in the above. It is found from comparison between FIG. 1B and FIG. 5B, there is difference that the electric field concentration point 62, expressed by narrowed distance between the adjacent iso-potential surfaces 72 appears also in FIG. 53, similarly to as in FIG. 2B.

As is known from the above, the distance between two p-type column regions 34, 38, disposed while placing the end potion 64 of the field oxide film 46 in between, is preferably adjusted so as not to produce the electric field concentration point 62 shown in FIG. 5B, and it is made possible to effectively suppress changes in the iso-potential surfaces at the end portion 64 of the field oxide film 46, typically by adjusting the distance between the mutually opposing end portions of two column regions 36, 38 (or 34, 38), disposed while placing the end portion 64 on the element forming region 54 side of the field oxide film 46, which is an element isolation region, to a level not larger than the distance of other adjacent column regions.

In the semiconductor device of this embodiment, it is also allowable, as shown in FIG. 1A, to arrange the p-type column regions 34 according to an orthogonal lattice pattern in a plan view in the element forming region 54 excluding the area facing to the end portion thereof, and to arrange the p-type column regions 38 according to a rhombic lattice pattern in the periphery region 56.

As shown in FIG. 6, of the p-type column regions 34, 36 in the element forming region 54 of the semiconductor device shown in FIG. 1A, the p-type column regions 36 disposed closest to the end portion 64 of the field oxide film 46 and having the largest width may be configured by, for example, two narrow p-type column regions 37. Also in FIG. 6, the distance between the p-type column regions 37 and the p-type column regions 38 disposed on the periphery region 56 side of the end portion 64 may be adjusted to not larger than the distance between other adjacent p-type column regions 34, 37.

Referring now back to FIG. 1B, in this embodiment, the p-type base region 51 is formed in the semiconductor substrate 58 along its main surface on the element forming region 54 side, as being connected to the column regions composing the parallel p-n layer 40, but is not formed under the field oxide film 46. This configuration successfully allows also the field oxide film 46 to effectively take part in insulation resistance.

Figure 7:
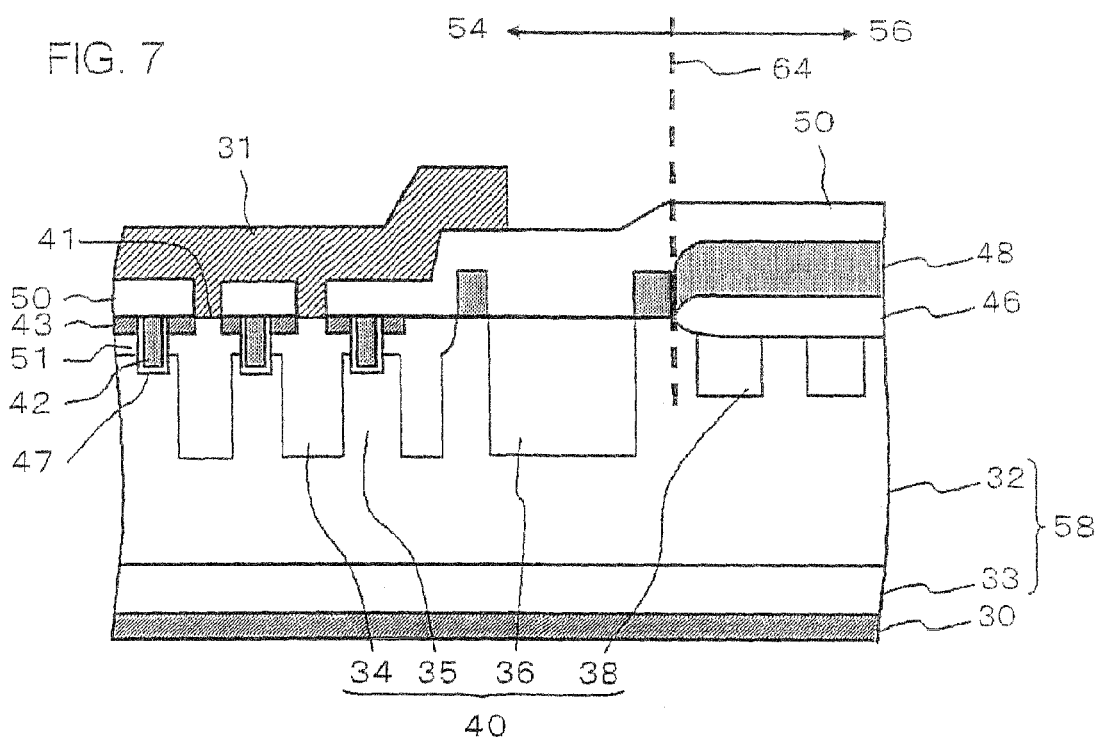
FIG. 7 is a sectional view of a semiconductor device showing another exemplary configuration of the p-type base region in this embodiment.

It is also allowable, as shown in FIG. 7, to avoid formation of the p-type base region in the element forming region 54 specifically in the area ranging from the peripherical side of a portion having the source region 43 formed therein to the end portion 64 of the field oxide film 46.

FIG. 8A is a top view showing a configuration of the outermost region of a semiconductor device according to a second embodiment of the present invention, and FIG. 8B is a sectional view taken along line a-a' in FIG. 8A.

The super-junction structure can achieve a higher performance when the p-type column regions 34, 36, 38 are arranged at regular intervals, and are most preferably arranged according to a rhombic lattice pattern in particular for the case where the p-type column regions are arranged in a two-dimensional manner. In the second embodiment having the p-type column regions uniformly arranged according to a rhombic lattice pattern as being distributed from the element forming region 54 to the periphery region 56, the end portion 64 on the element forming region 54 side, in a plan view of the semiconductor device, of the field oxide film 46 which is an element isolation region, is provided along the periphery of the p-type column regions which reside between the element forming region 54 and the periphery region 56, so that the end portion 64 contains a kinked profile as shown in FIG. 8B. In this configuration, there are no p-type column regions formed beneath the end portion 64 of the field oxide film 46, and the column regions 38 is formed as at least one column region under the field oxide film 46.

The parallel p-n layer 40 has, alternately arranged therein, the n-type drift regions 35 and p-type column regions 34, 36, 38 which allow current to flow therethrough in the ON state, and are depleted in the OFF state.

In the ON state of this configuration, a channel is formed in the p-type base region 51 specifically in an area brought into contact with the gate electrode 42, and between the source region 43 and the n-type drift region 35, so that current flows from the source electrode 31 to the drain electrode 30. On the other hand, in the OFF state, the junction portions between the n-type drift region 35 and each of the p-type column regions 34, 36, 38 in the parallel p-n layer 40 are depleted, and the depletion regions expand over the n-type drift region 35 between every adjacent p-type column regions 34, 36, 38. Because the p-type columns herein are not formed anywhere beneath the end portion 64 of the field oxide film 46, the iso-potential surfaces 72 never have discontinuous portion as shown in FIG. 8B, and consequently produces no electric field concentration point.

If the end portion 64 of the field oxide film 46 is formed as having a linear profile, despite the arrangement of the p-type column regions as shown in FIG. 8A, the end portion 64 should cross the p-type column regions located at the boundary between the element forming region 54 and the periphery region 56, and the electric field concentration point 62 as shown in FIG. 2 inevitably occurs. Even for the case where the p-type columns are arranged as being sufficiently thinned so as to avoid crossing with the linear-profiled end portion 64, a risk still remains in that the electric field concentration point 62 as shown in FIG. 2 may occur, because the end portion 64 resides sufficiently close to the p-type columns.

Figure 9:
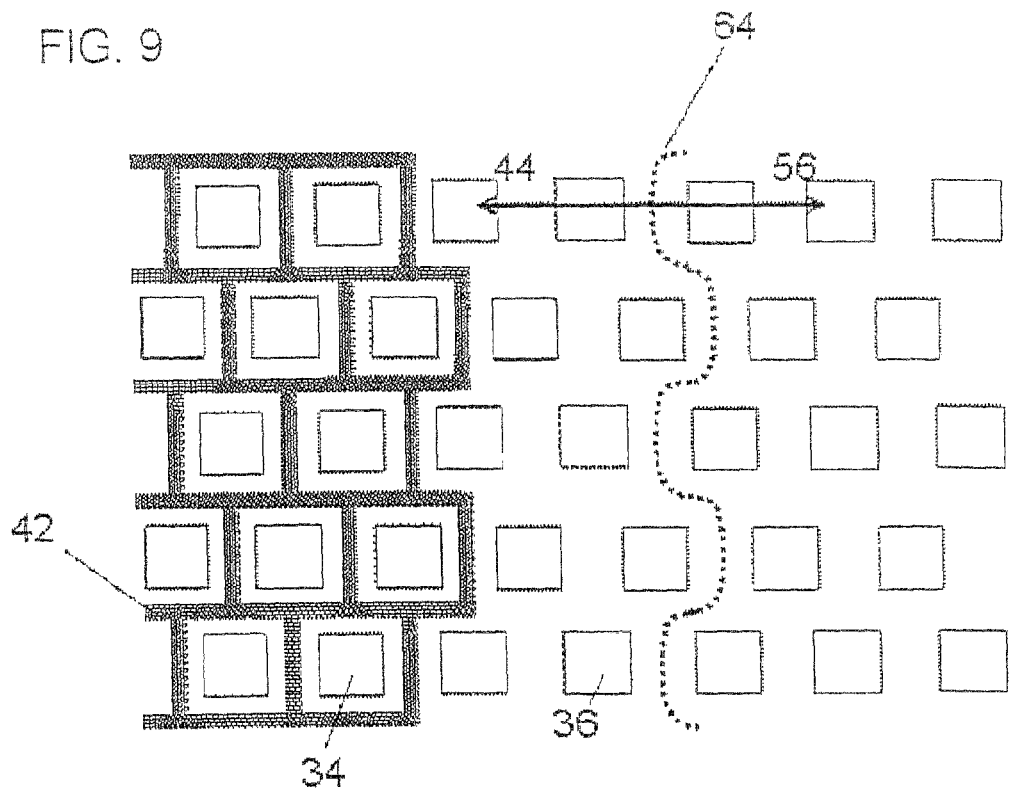
FIG. 9 is a top view showing another exemplary arrangement of the field oxide film in the second embodiment.

The profile of the end portion 64 of the field oxide film 46 may contain curved portion as shown in FIG. 9, rather than the kinked-line profile shown in FIG. 8A. The arrangement of the p-type column regions is not limited to the rhombic lattice arrangement, but may also be a hexagonal arrangement or the like.

Similar effects can be obtained by providing the p-type column regions as being buried in the n-type drift region 35 as shown in FIG. 3, or by composing each of the p-type column regions with a plurality of regions as being split in the thickness-wise direction of the epitaxial layer 32.

Figure 10A:
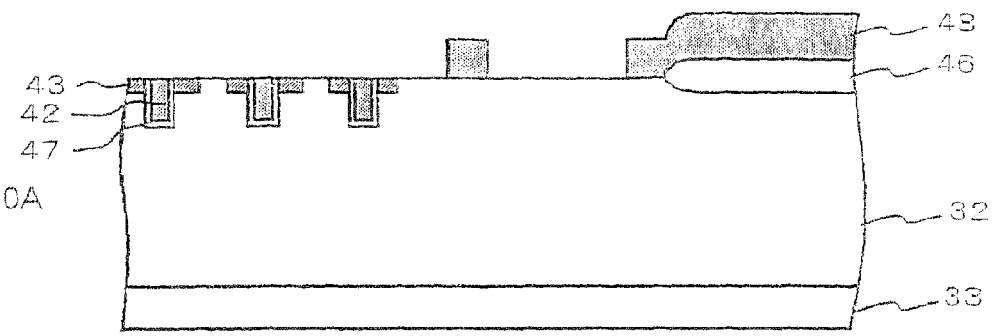
FIGS. 10A to 10C are sectional views showing exemplary process steps of fabricating the semiconductor device of the above-described embodiment.
Figure 10B:
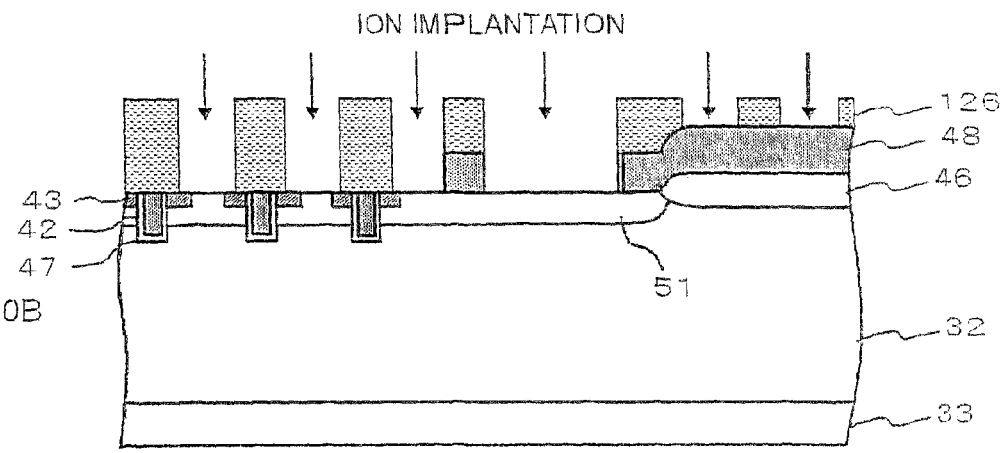
Figure 10C:
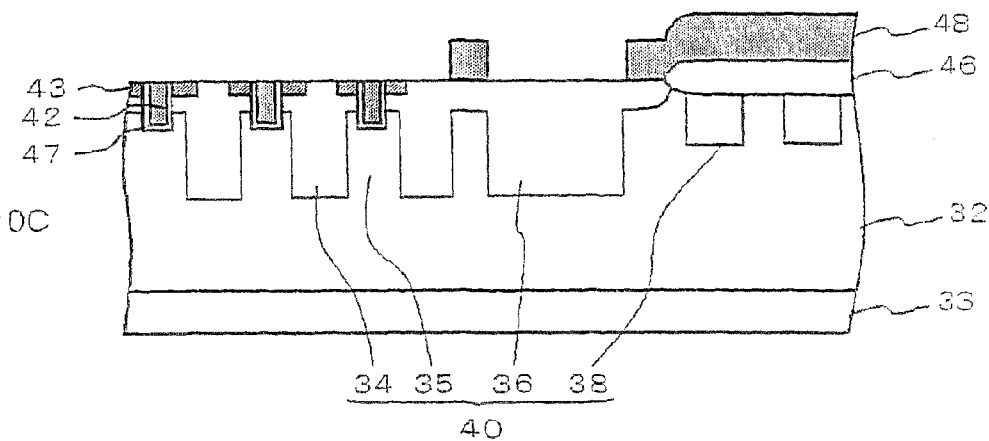

Paragraphs below will describe process steps of fabricating the semiconductor device 100 of this embodiment. FIGS. 10A to 10C are sectional views showing process steps of fabricating the semiconductor device of this embodiment.

First, on the main surface of the n$^+$-type semiconductor substrate 33, silicon is epitaxially grown, while being doped typically with phosphorus (P), to thereby form the epitaxial layer 32. Next, in the periphery region, the element isolation region is formed on the surface of the epitaxial layer 32, and the element isolation region is subjected to the LOCOS (local oxidation of silicon) process, to thereby form the field oxide film 46.

Next, boron (B) for example is doped by ion implantation into the surficial portion of the epitaxial layer 32, to thereby form the p-type base region 51.

The surficial region of the epitaxial layer 32 is then selectively etched with the aid of a photolithographic technique, to thereby form the trench. Next, the silicon oxide film is formed on the inner wall of the trench and on the surface of the epitaxial layer 32 by thermal oxidation. A portion of the silicon oxide film formed on the top surface of the epitaxial layer 32 is then removed, to thereby leave the silicon oxide film as the gate insulating film 47 on the inner wall of the trench. Next, a polysilicon layer is formed by the CVD (chemical vapor deposition) process in the trench and on the surface of the epitaxial layer 32. The polysilicon layer is then selectively removed by the etch back, so as to leave it only on the surface of the gate insulating film 47 in the trench and in a predetermined region of the surface of the epitaxial layer 32. As a consequence, the gate electrode 42 and the field electrode 48 are formed according to the patterns shown in FIG. 10A.

Next, arsenic (As) ion for example is implanted with the aid of a photolithographic technique to thereby form the high-concentration n-type (n$^+$-type) source regions 43 in the surficial portion of the p-type base regions 51 and around the gate electrode 42. By these procedures, a structure shown in FIG. 10A is formed.

Next, a mask 126 having a predetermined geometry is formed, and boron (B) ion for example is implanted through the mask 126 into the surficial portion of the epitaxial layer 32 (FIG. 10B). The ion implantation process herein may be divided into a plurality of times, under varied energy for each time. The mask 126 is then etched off (FIG. 10C). In this embodiment, the p-type column regions 34, 36, 38 are formed to a depth not reaching the n$^+$-type semiconductor substrate 33 which functions as the drain region.

Next, the interlayer insulating film 50 is formed on the surface of the epitaxial layer 32, and then patterned according to a predetermined geometry. Next, an electrode layer is formed typically by sputtering using an aluminum target. The electrode layer is then patterned according to a predetermined geometry, to thereby form the source electrode 31. Also on the back surface of the n$^+$-type semiconductor substrate 33, the drain electrode 30 is formed similarly by sputtering. By these procedures, the semiconductor device having a structure as shown in FIG. 1B is obtained.

In the above-described method of fabrication, the field electrode 48 is formed before the p-type column regions 34, 36, 38 are formed, whereas there are no special limitations on any other procedures such that, for example, the formation of which of the p-type base regions 51, the source regions 43 and the field electrode 48 should precede the others. These constituents may be formed according to any order of process steps different from that described in the above.

The present invention has been described referring to the preferred embodiments. The embodiments are merely an exemplary ones, and those skilled in the art can readily understand that combinations of the individual constituents and process may be modified in various ways, and that also such modifications are within a scope of the present invention.

The above-described embodiment dealt with the case where the first conductivity type is n-type and the second conductivity type is p-type, whereas the first conductivity type may be p-type and the second conductivity type may be n-type.

A power MOSFET was explained in the above as an embodiment of the semiconductor device without limitation, and similar effects can be obtained also when the semiconductor device is configured, for example, as IGBT or PIN diode.

It is apparent that the present invention is not limited to the above embodiment, that may be modified and changed without departing from the scope and spirit of the invention.

The invention claimed is:

1. A semiconductor device comprising:
   a drift region of a first conductivity type;
   a trench gate structure formed in the drift region, the trench gate structure having a gate insulating film and a gate electrode therein;
   base regions of a second conductivity type formed in the drift region;
   source regions of the first conductivity type formed in the base regions, respectively;
   a field oxide film formed in the drift region and surrounding the trench gate structure;
   first column regions of the second conductivity type formed in the drift region, the first column regions being formed beneath the base regions, respectively; and
   second column regions of the second conductivity type formed in the drift region, the second column regions being formed beneath the field oxide film,
   wherein an inner edge of the field oxide film is located in a space between outermost column regions of the first column regions and innermost column regions of the second column regions.

2. The semiconductor device according to claim 1, wherein a distance between each adjacent pair of the outermost column regions of the first column regions and the innermost column regions of the second column regions is smaller than both a distance between each adjacent pair of the first column regions and a distance between each adjacent pair of the second column regions.

3. The semiconductor device according to claim 1, wherein the trench gate structure is arranged according to a mesh structure.

4. The semiconductor device according to claim 1, wherein an outermost base region is formed between the trench gate structure and the inner edge of the field oxide film.

5. The semiconductor device according to claim 4, wherein the outermost base region is enlarged beyond the inner edge of the field oxide film.

6. The semiconductor device according to claim 1, wherein some of the first column regions that are surrounded by the trench gate structure in a plan view are arranged according to a rhombic lattice pattern in a plan view.

7. The semiconductor device according to claim 6, wherein the second column regions are arranged according to an orthogonal lattice pattern in a plan view.

8. The semiconductor device according to claim 7, wherein the inner edge of the field oxide film is arranged according to a straight pattern in a plan view.

9. The semiconductor device according to claim 6, wherein the second column regions are arranged according to a rhombic lattice pattern in a plan view.

10. The semiconductor device according to claim 9, wherein the inner edge of the field oxide film is arranged according to a serpentine pattern in a plan view.

* * * * *